US007171011B2

(12) United States Patent
Morimoto

(10) Patent No.: US 7,171,011 B2
(45) Date of Patent: Jan. 30, 2007

(54) ACOUSTIC DRIVE CIRCUIT

(75) Inventor: Masashi Morimoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 619 days.

(21) Appl. No.: 10/303,949

(22) Filed: Nov. 26, 2002

(65) Prior Publication Data

US 2003/0219135 A1 Nov. 27, 2003

(30) Foreign Application Priority Data

May 24, 2002 (JP) ............................ 2002-150053

(51) Int. Cl.
*H03F 21/00* (2006.01)

(52) U.S. Cl. ...................................... 381/120; 381/111

(58) Field of Classification Search .................. 330/10, 330/251; 381/120, 28, 74, 111, 116, 117, 381/400, 401

See application file for complete search history.

(56) References Cited

U.S. PATENT DOCUMENTS 4,360,707 A * 11/1982 Joseph et al. ............... 381/117
4,968,948 A * 11/1990 Tokumo et al. ............... 330/10

FOREIGN PATENT DOCUMENTS

JP 8-222976 8/1996
JP 2709984 10/1997

* cited by examiner

*Primary Examiner*—Xu Mei
*Assistant Examiner*—Corey Chau
(74) *Attorney, Agent, or Firm*—VolentineFrancos&Whitt,PLLC

(57) ABSTRACT

An acoustic drive circuit for driving a headphone for converting variation of magnetic force, occurring to a voice coil, in sound, and outputting the sound, includes a power amplifier for amplifying a signal at a frequency within the speech band, and outputting the signal after amplification, at a voltage with a given bias voltage superposed thereon, to one end of the voice coil of the headphone, and a pulse generation circuit for generating a pulse signal at a frequency higher than those in the speech band, having an average voltage equivalent to the bias voltage, and for outputting the pulse signal to the other end of the voice coil. The pulse generation circuit generates rectangular waves at a frequency higher than those in the speech band, having a duty ratio such that the average voltage is equivalent to the bias voltage.

8 Claims, 2 Drawing Sheets

ACOUSTIC DRIVE CIRCUIT

FIELD OF THE INVENTION

The invention relates to an acoustic drive circuit for driving a headphone and a speaker.

BACKGROUND OF THE INVENTION

FIG. 1 is a view showing an example of the configuration of a conventional headphone drive circuit.

This headphone drive circuit comprises an amplifier 10R for amplifying power of a right-side signal SR, and an amplifier 10L for amplifying power of a left-side signal SL, and output signals of the amplifiers 10R, 10L are fed to a headphone 30 via respective capacitors 20R, 20L, for coupling.

The amplifiers 10R, 10L are of the same configuration, and, for example, the amplifier 10R has a terminal 11R for receiving the right-side signal SR, the terminal 11R being connected to a negative (−) input terminal of a differential amplifier 13R via a resistor 12R. An output of a differential amplifier 13R is connected to the negative (−) input terminal via a feedback resistor 14R. Further, a reference voltage Vref is delivered to a positive (+) input terminal of the differential amplifier 13R. In addition, the output of the differential amplifier 13R is connected to a terminal 31R of the headphone 30 via the capacitor 20R.

The headphone 30 comprises the terminal 31R for receiving the right-side signal, a terminal 31L for receiving the left-side signal, and a terminal 32 connected to a common potential GND. A voice coil 33R extends between the terminals 31R, 32, and a voice coil 33L extends between the terminals31L, 32. Variation of a magnetic field, occurring due to electric current flowing through the voice coils 33R, 33L, causes vibrating plates 34R, 34L to vibrate, thereby outputting sound.

With the headphone drive circuit, the signals SR, SL, delivered to the terminals 11R, 11L are amplified in power through the agency of the amplifiers 10R, 10L, respectively, thereby outputting amplified signals that are outputs of the amplifiers 10R, 10L, respectively, as biased by the reference voltage Vref (for example, a voltage equivalent to ½ of a power source voltage VDD).

The signals sent out from the amplifiers 10R, 10L are transmitted to the terminals 31R, 31L of the headphone 30 via the capacitors 20R, 20L, respectively, to be delivered to one end of the voice coils 33R, 33L, respectively. The other end of the voice coils 33R, 33L, respectively, is connected to an installation potential GND via the terminal 32. As a result, only signals at frequencies within the speech band, after elimination of DC portions thereof, are impressed to the respective voice coils 33R, 33L, and converted into sound to be sent out.

The conventional headphone drive circuit, however, has had the following problem. That is, because the outputs of the amplifiers 10R, 10L, respectively, are biased by the reference voltage Vref, the capacitors 20R, 20L, for coupling, are required in order to block DC from flowing to the voice coils 33R, 33L, respectively. These capacitors need to have a large capacitance to allow speech signals at low frequencies to pass therethrough.

Assuming that, for example, input impedance Zi of a voice coil 33 is 32 Ω, and a cutoff frequency of a bypass filter comprising the input impedance Zi and a capacitor 20 is 20 Hz, capacitance required of the capacitor 20 is 250 μF. Since a capacitor of such a large capacitance can not be used as an element of an integrated circuit, the capacitor needs to be installed externally, thus causing problems such as inability of implementing circuit miniaturization, and reduction in cost.

SUMMARY OF THE INVENTION

An acoustic drive circuit for driving a headphone for converting variation of magnetic force, occurring to a voice coil, in sound, and outputting the sound, comprises a power amplifier for amplifying a signal at a frequency within the speech band, and outputting the signal after amplification, at a voltage with a given bias voltage superposed thereon, to one end of the voice coil of the headphone, and a pulse generation circuit for generating a pulse signal at a frequency higher than those in the speech band, having an average voltage equivalent to the bias voltage, and for outputting the pulse signal to the other end of the voice coil. The pulse generation generates rectangular waves at a frequency higher than those in the speech band, having a duty ratio such that the average voltage is equivalent to the bias voltage.

PREFERRED EMBODIMENT OF THE INVENTION

Figure 1:
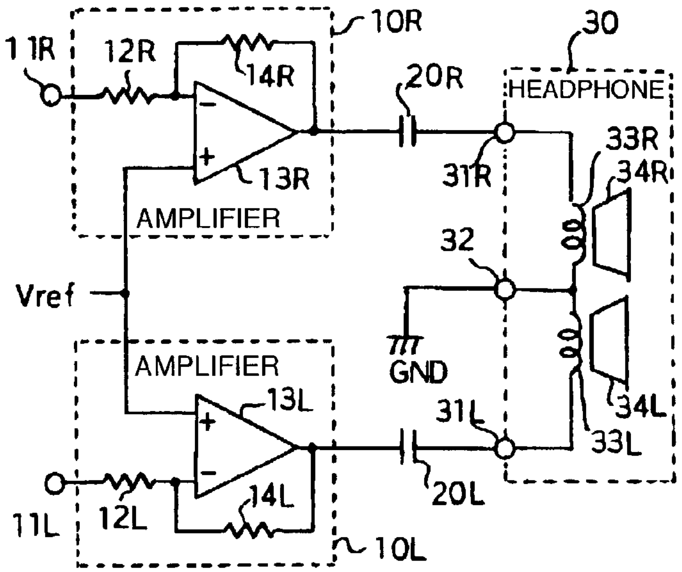
FIG. 1(PRIOR ART)
FIG. 1 is a circuit diagram showing the configuration of a conventional headphone drive circuit.
Figure 2:
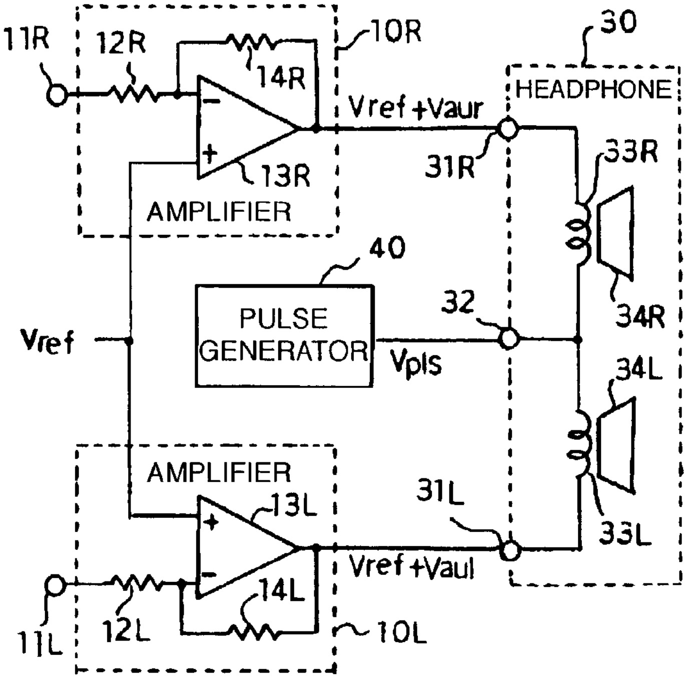
FIG. 2 is a circuit diagram showing the configuration of an embodiment of a headphone drive circuit diagram according to the invention.

FIG. 2 is a circuit diagram showing the configuration of an embodiment of a headphone drive circuit diagram according to the invention, and in the figure, elements corresponding to those in FIG. 1 are denoted by like reference numerals.

The headphone drive circuit comprises power amplifiers 10R, 10L, for amplifying power of a right-side signal SR and a left-side signal SL, respectively, and a pulse generator 40 for generating a pulse signal Vpls at an RF. Further, output signals of the amplifiers 10R, 10L, respectively, and the pulse signal Vpls at the RF, outputted from the pulse generator 40, are fed to a headphone 30.

The amplifiers 10R, 10L are of the same configuration, and, for example, the amplifier 10R has a terminal 11R for receiving the right-side signal SR, the terminal 11R being connected to a negative (−) input terminal of a differential amplifier 13R via a resistor 12R. Further, a reference voltage Vref is delivered to a positive (+) input terminal of a differential amplifier 13R. Outputs of the amplifier 10R, 10L are connected to terminals 31R, 31L, of the headphone 30, respectively.

Meanwhile, the pulse generator 40 generates the pulse signal Vpls in rectangular waveform at a frequency (for example, 2 MHz) sufficiently higher than those in the speech band, having a duty ratio such that average power is equivalent to the reference voltage Vref, and the output of the pulse generator 40 is fed to a terminal 32 of the headphone 30.

The headphone 30 comprises the terminal 31R for receiving the right-side signal, a terminal 31L for receiving the left-side signal, respectively, and the terminal 32 for receiving the pulse signal Vpls. A voice coil 33R extends between the terminals31R, 32, and a voice coil 33L extends between the terminals31L, 32. Variation of a magnetic field, occurring due to electric current flowing through the voice coils 33R, 33L, causes vibrating plates 34R, 34L to vibrate, thereby outputting sound.

Referring to FIG. 2, operation of the headphone drive circuit is described hereinafter.

Upon delivery of the right-side signal SR, and the left-side signal SL to the terminals 11R, 11L of the headphone drive circuit, respectively, these signals are amplified in power through the agency of the amplifiers 10R, 10L, respectively. Then, there are sent out signals at voltages Vaur, Vaul, respectively, that are outputs of the amplifiers 10R, 10L, respectively, as biased by the reference voltage Vref (for example, a voltage equivalent to ½ of a power source voltage VDD) after amplification. That is, a voltage outputted from the amplifier 10R becomes Vref+Vaur, and a voltage outputted from the amplifier 10L becomes Vref+Vaul.

With the pulse generator 40, there is generated the pulse signal Vpls in rectangular waveform, having a duty ratio such that an average voltage Vav becomes equivalent to the reference voltage Vref.: For example, there is generated the pulse signal Vpls at a frequency of 2 MHz, having a wave height value at the power source voltage VDD, and a duty ratio of ½. As a result, assuming that the signal at a frequency of 2 MHz together with harmonic thereof is at a voltage of Vrf, a voltage outputted by the pulse generator 40 is Vav+Vrf.

Acoustic signals sent out from the amplifiers 10R, 10L are fed to one end of the voice coils 33R, 33L, respectively, via the terminals 31R, 31L of the headphone 30, respectively. Further, the pulse signal Vpls is fed to the other end of the voice coils 33R, 33L, respectively, via the terminal 32.

Accordingly, a Vref portion, and an average voltage Vav portion of the respective voltages impressed to both extremities of the voice coil 33R of the headphone 30 cancel each other out, so that DC does not flow through the voice coil 33R. Similarly, a Vref portion, and an average voltage Vav portion of the respective voltages impressed to both extremities of the voice coil 33L of the headphone 30 cancel each other out, so that DC does not flow through the voice coil 33L.

Meanwhile, current caused by the RF signal at Vrf, impressed to the other end of the voice coils 33R, 33L, respectively, is limited to a very small value owing to an inductance component of the voice coils 33R, 33L, respectively. Further, even if such weak current at an RF flows through the voice coils 33R, 33L, the vibrating plates 34R, 34L are incapable of responding thereto, thereby exerting no effect on sound outputted in terms of phonetic perception. Thus, the headphone 30 sends out sound corresponding to the voltages Vaur and Vaul, respectively.

Figure 3:
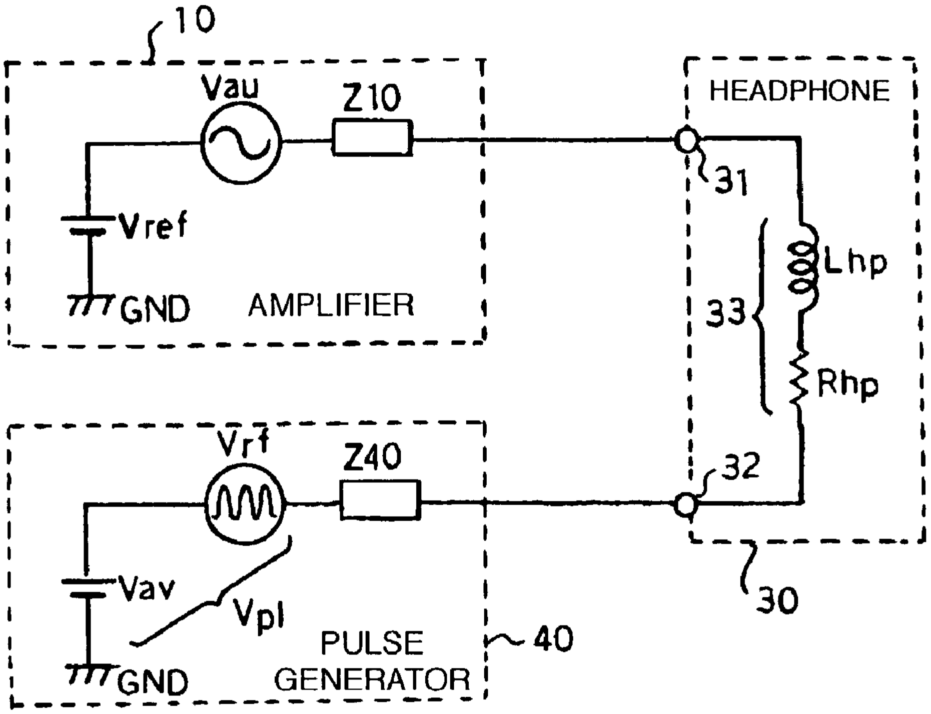
FIG. 3 is a circuit diagram showing the equivalent circuit of the circuit in FIG. 2.

Now, operation described above is further described by use of an equivalent circuit. FIG. 3 is a circuit diagram showing the equivalent circuit of one channel in FIG. 2.

As shown in FIG. 3, an amplifier can be represented by a series circuit comprising a DC power source for outputting a reference voltage Vref, a signal source for outputting an amplified signal at a frequency within the speech band, at a voltage Vau, and an output impedance Z10 while the headphone 30 can be represented by a series circuit comprising an inductance component Lhp and resistance Rhp of a voice coil 33. Further, a pulse generator 40 can be represented by a series circuit comprising a DC power source for outputting an average voltage Vav of a pulse signal Vpls, an RF signal source for outputting the fundamental frequency at Vrf of the pulse signal Vpls and a harmonic component at Vrfh, and output impedance Z40.

These values are shown by way of example as follows.

$$Z10+Z40=Rhp=32\ \Omega$$

$$Lhp=1\ mH$$

$$Vref=Vav=VDD/2=1.5V$$

Hence, current I flowing through the voice coil 33 of the headphone 30 is represented by expression (1) as follows.

$$I=Vau/(Z10+Z40+Rhp+j\omega_{au}Lhp)-Vrf/(Z10+Z40+Rhp+j\omega_{rf}Lhp)=Vau/(64+j0.001\omega_{au})-Vrf/(64+j0.001\omega_{rf}) \quad (1)$$

In this case, since the signal at Vrf has an angular frequency $\omega_{rf}$ that is high frequency not lower than 2 MHz, impedance $\omega_{rf}$Lhp due to the inductance component Lhp becomes an extremely large value as compared with a resistance component Z10+Z40+Rhp, so that current due to the signal at Vrf becomes negligible in value. Hence, the current I flowing through the headphone 30 can be approximated by expression (2)

$$I=Vau/(Z10+Z40+Rhp+j\omega_{au}Lhp) \quad (2)$$

where $\omega_{au}$ is an angular frequency within the speech band.

Thus, the headphone drive circuit according to the present embodiment comprises the pulse generator 40 that generates the pulse signal Vpls, having the duty ratio such that the average voltage is equivalent to the reference voltage Vref, to be impressed to the voice coil 33 of the headphone 30. As a result, a headphone drive circuit requiring no capacitor for blocking DC can be made up, so that the invention has an advantageous effect in that miniaturization of the circuit and reduction in cost thereof can be attained.

It is to be pointed that the invention is not limited to the present embodiment as described in the foregoing, and variations thereto will occur to those skilled in the art without departing from the spirit of the invention. For example, the following variations are conceivable.

(a) A stereo-headphone drive circuit for outputting right-side and left-side speech signals after amplification, respectively, has been described hereinabove, however, the invention is also applicable to a drive circuit with one channel or not less than three channels.

(b) The drive circuit according to the invention is not limited in application to headphones, but can be used as a speaker drive circuit.

(c) Since an example wherein the reference voltage Vref is equivalent to ½ of the power source voltage VDD, the duty ratio of the pulse signal Vpls is set to ½, however, the duty ratio of the pulse signal Vpls needs to be set so as to match an actual reference voltage Vref. The invention becomes capable of coping with a variety of reference voltages Vref by rendering the duty ratio of the pulse signal Vpls generated by the pulse generator 40 to be adjustable.

(d) A pulse signal generated by the pulse generator 40 is not limited in waveform to a rectangular waveform. The pulse generator 40 may generate any pulse signal at a frequency sufficiently higher (for example, higher by at least two orders of magnitude) than those in the speech band and with the average voltage thereof, equivalent to the reference voltage Vref.

(e) The differential amplifier 13 is used for the amplifier 10, however, an amplifier of other configuration may be similarly used.

As described hereinbefore, the headphone drive circuit according to the invention comprises power amplifiers for outputting a signal within the speech band at a voltage with a bias voltage superimposed thereon to one end of voice coils of a headphone, and a pulse generator for generating a pulse signal whose average voltage is equivalent to the bias voltage to be outputted to the other end of the voice coils, so that DC will not flow through the voice coils of the headphone, thereby eliminating the need for coupling capacitors of large capacitance.

Further, because rectangular waves generated by the pulse generator is rendered into a waveform having a duty ratio such that an average voltage is equivalent to the bias voltage, the average voltage of the pulse signal can be caused to easily match the bias voltage of the power amplifiers by adjusting the duty ratio.

What is claimed is:

1. An acoustic drive circuit comprising:

a first power amplifier having a first input terminal for receiving a first acoustic signal, a second input terminal connected to receive a reference voltage, and a first output terminal, the first power amplifier including a first differential amplifier having a first negative input, a first positive input connected to the second input terminal, and a first output connected to the first output terminal, and also including a first resistor connected between the first input terminal and the first negative input, and a first feedback resistor connected between the first output and the first negative input of the first differential amplifier;

a second power amplifier having a third input terminal for receiving a second acoustic signal, a fourth input terminal connected to receive the reference voltage, and a second output terminal, the second power amplifier including a second differential amplifier having a second negative input, a second positive input connected to the fourth input terminal, and a second output connected to the second output terminal, and also including a second resistor connected between the third input terminal and the second negative input, and a second feedback resistor connected between the second output terminal and the second negative input of the second differential amplifier; and a pulse generator having an output terminal for outputting a pulse signal having a frequency higher than frequencies in a speech band and having an average voltage that is equal to about the reference voltage, wherein the first output terminal of the first power amplifier is connected to one end of a first voice coil of a headphone and the second output terminal of the second power amplifier is connected to one end of a second voice coil of the headphone, and the output terminal of the pulse generator is connected to a common terminal between other ends of the first and second voice coils.

2. An acoustic drive circuit according to claim 1, wherein the reference voltage is equal to about a half of a power supply voltage.

3. An acoustic drive circuit according to claim 1, wherein the frequency of the pulse signal is about 2 MHz.

4. An acoustic drive circuit for driving a voice coil having first and second ends, comprising:

a power amplification circuit having a first input terminal for receiving an acoustic signal having a first voltage level, a second input terminal having a reference voltage applied thereto, and an output terminal connected to the first end of the voice coil and that outputs a drive signal having a second voltage level that is equal to a sum of the first voltage level and a level of the reference voltage; and a pulse generation circuit connected to the second end of the voice coil, the pulse generation circuit generating a pulse signal having a frequency higher than frequencies of a speech band and having an average voltage level equivalent to the level of the reference voltage, wherein the power amplification circuit includes a differential amplifier having a negative input connected to the first input terminal, a positive input connected to the second input terminal and an output connected to the output terminal, and wherein the power amplification circuit further includes an input resistor connected between the first input terminal and the negative input of the differential amplifier.

5. An acoustic drive circuit according to claim 4, wherein the power amplification circuit further includes a feedback resistor connected between the negative input and the output of the differential amplifier.

6. An acoustic drive circuit according to claim 4, wherein the reference voltage is equal to about a half of a power supply voltage.

7. An acoustic drive circuit according to claim 4, wherein the frequency of the pulse signal is about 2 MHz.

8. An acoustic drive circuit according to claim 4, wherein the voice coil is included in a headphone.

* * * * *